United States Patent [19]

Moulene et al.

[11] Patent Number: 5,034,688
[45] Date of Patent: Jul. 23, 1991

[54] TEMPERATURE CONDITIONING SUPPORT FOR SMALL OBJECTS SUCH AS SEMI-CONDUCTOR COMPONENTS AND THERMAL REGULATION PROCESS USING SAID SUPPORT

[75] Inventors: Daniel Moulene, Villennes-sur-Seine; Pierre Gourdon, Maisons-Laffitte both of France

[73] Assignee: ETS Gourdon, Maisons-Laffitte, France

[21] Appl. No.: 345,410

[22] Filed: Apr. 28, 1989

[30] Foreign Application Priority Data

May 5, 1988 [FR] France .................... 88 06055

[51] Int. Cl.⁵ .................... G01R 31/02; F28F 7/00
[52] U.S. Cl. .................... 324/158 F; 165/80.4; 324/158 P; 361/385
[58] Field of Search ............ 324/158 F, 158 P, 72.5; 165/80.4; 361/385; 357/82

[56] References Cited

U.S. PATENT DOCUMENTS

| 3,455,376 | 7/1969 | Beurtheret | 165/80.4 |
| 3,710,251 | 1/1973 | Hagge et al. | 324/158 F |
| 4,862,075 | 8/1989 | Choi et al. | 324/158 F |

FOREIGN PATENT DOCUMENTS

| 0219692 | 4/1987 | European Pat. Off. |  |
| 3138521 | 3/1983 | Fed. Rep. of Germany | 165/80.4 |
| 3408771 | 9/1985 | Fed. Rep. of Germany |  |
| 3605554 | 8/1987 | Fed. Rep. of Germany |  |
| 58-60269 | 9/1983 | Japan |  |
| 1491570 | 11/1977 | United Kingdom |  |
| 2180959 | 4/1987 | United Kingdom |  |

OTHER PUBLICATIONS

IBM Technical Disclosure Bulletin, vol. 19, No. 12, May 1977, pp. 4688–4689, New York, US; V. W. Antonetti et al.: "Air Jet Spot Cooling".
Patent Abstracts of Japan, vol. 7, No. 150 (P-207) (1295), Jun. 30, 1983; & JP≧A–58 60 269 (Meidensha K.K.) 09-04-83.
IEEE Transactions on Industry Applications, vol. IA-13, No. 3, May/Jun. 1977, pp. 254–259; S. B. Sample et al.: "Reliability Testing of Triacs".
IBM Technical Disclosure Bulletin, vol. 20, No. 4, Sep. 1977, pp. 1440–1441, New York, US; V. Y. Doo et al.: "Semiconductor Chip Cooling Package".

Primary Examiner—Ernest F. Karlsen
Attorney, Agent, or Firm—Rosen, Dainow & Jacobs

[57] ABSTRACT

The invention concerns a temperature conditioning support for thermal tests on small objects such as semiconductor wafers incorporating integrated circuits. It consists of a platen and a hollow base. Inside the hollow cavity is contained a serpentine which can convey thermal fluid capable of heating and/or cooling the platen to achieve temperature regulation of the object placed on the platen, according to data supplied by a thermometric system that includes a temperature sensor associated to said support. The platen is made of electrically insulating and thermally conducting ceramic, the base being made of a material whose thermal expansion coefficient is substantially equal to that of the platen. A thin-film electrical resistance can be provided to ensure heating and, optionally, temperature measurement of the platen.

19 Claims, 4 Drawing Sheets

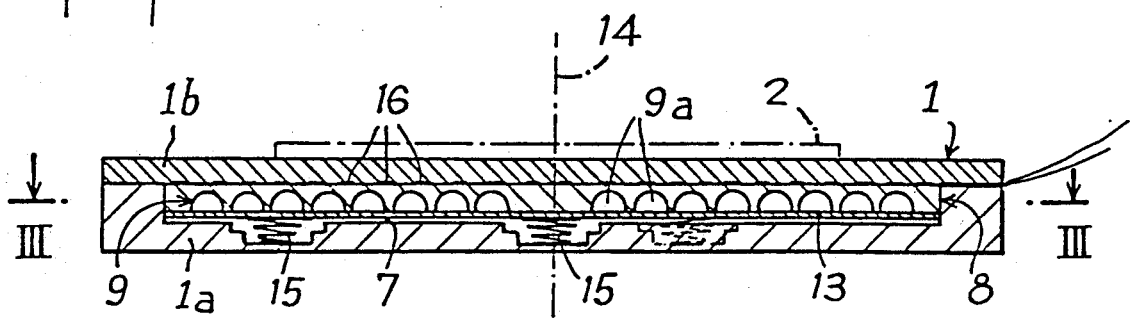
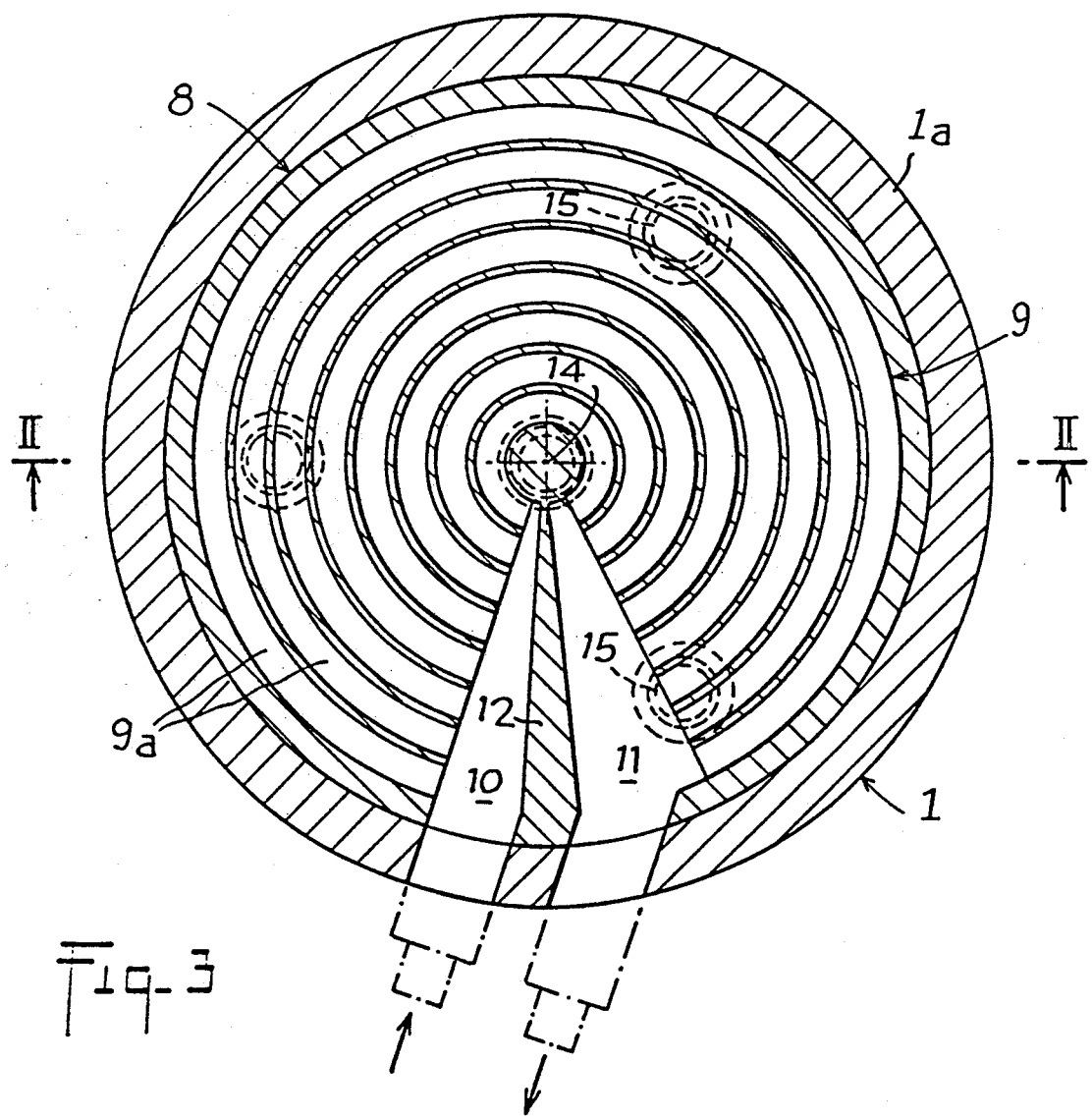

TEMPERATURE CONDITIONING SUPPORT FOR SMALL OBJECTS SUCH AS SEMI-CONDUCTOR COMPONENTS AND THERMAL REGULATION PROCESS USING SAID SUPPORT

BACKGROUND OF THE INVENTION

The invention primarily concerns a temperature conditioning support for thermal tests on small objects such as semiconductor wafers containing integrated circuits, comprising an platen and a base which receives the platen, the two elements being conformed so that once assembled they leave an internal cavity, inside which can flow a thermal fluid capable of heating and/or cooling the platen in view of providing the temperature regulation of the object placed on the platen, according to data supplied by thermometric system that includes a temperature sensor associated to said support.

Temperature conditioning supports of the type considered are used in connection with probe testing apparatus for integrated circuits on wafers or chips or similar electronic components such as hybrid circuits. The component under test is placed on the support which has the dual function of bringing and maintaining the component at a predetermined control temperature and of positioning the component extremely accurately with respect to the test probes, using an ajustable mechanical platform.

Known temperature conditioning supports usually employ an aluminimum platen. This introduces many drawbacks: it is difficult to produce aluminium workpieces that meet tight tolerances, even with careful and costly machining operations. Moreover, aluminium is prone to thermally induced deformations, which upset the support's mechanical stability. Also, because of the relative softness of aluminium, successive dismantling and reassembly of the support cannot be performed without having to remachine the constituent elements. Furthermore, aluminium being a metal, it is difficult to obtain high insulation resistance with a metal platen which, besides, produces a high stray capacitance which can affect the quality of electrical measurements carried out on the electronic components.

In addition, such a temperature conditioning support should provide high precision not only from the mechanical and dimensional point of view, but also as concerns temperature regulation uniformity and tolerances. Yet, the required regulation characteristics are difficult to achieve with an aluminium support platen.

OBJECT AND SUMMARY OF THE INVENTION

The aim of the invention is to overcome all the above-mentioned drawbacks.

To that end, the above-defined temperature conditioning support platen according to the invention is made from electrically insulating and thermally conducting ceramic material, the base being formed from a material having a thermal expansion coefficient substantially equal to that of ceramic platen. Different types of ceramic can be used in this case, such as aluminium nitride, silicon carbide or a vitrious ceramic.

The platen made of a ceramic material can be machined at a relatively low cost with extreme precision (of the order of one micron) and has an excellent dimensional stability as well as a low thermal expansion coefficient. It can thus meet tight mechanical tolerances in machining the constituent parts, and this over a wide temperature range, since the equal thermal expansion coefficients of the platen and the base eliminate thermally induced deformations of the support. Moreover, the high degree of hardness of such material allows the platen to be dismantled and reassembled without having to return the support to the factory. Furthermore, the ceramic's insulating properties solve the problem of electrical insulation between the objects under test and the support, and stray capacitances are greatly reduced. These characteristic properties of ceramic also allow a non-insulated electrical element such as a thin film resistance to be deposited on one face of the platen, as will be explained further.

A thermally conducting layer which can also be electrically conducting—if that does not cause disturbances—and made of material such as gold, can be applied to the top surface of the platen.

The base can also be made from ceramic material, preferably of the thermal insulating type, in order to reduce heat losses into the device on which rests the support, and thus to improve the temperature regulation performance. For the same purposes, the base can be formed from several parts designed to ensure optimum thermal insulation of the support.

In a very simple design, the platen can be disc shaped with two parallel plane faces, the base having the form of a dish which defines the above-mentioned cavity.

Advantageously, the internal cavity contains a tubular thermal fluid circulation system which offers a constant flow cross-section to the fluid. This allows the use of a liquid or a gas without risk, in the latter case, of generating local temperature difference on the platen as a result of gas compression or expansion effects.

This tube system can comprise several conduits of uniform cross-section arranged in parallel between an entrance chamber and an exit chamber, or again it can be formed by a constant cross-section conduit arranged in the form of a double spiral so that two adjacent convolutions convey the thermal fluid in opposite directions, so contributing to the temperatures uniformity at all points on the platen.

According to another characteristic of the invention, the above tube system can be produced either directly in the platen or inside the base. Alternatively it can be made within a disc that comes inside the cavity, either by means of a tube proper buried in the disc, or by forming grooves in the latter (by machining, engraving, moulding, etc. . . ). The height of this disc can be slightly less than the depth of the internal cavity, springs being provided at the base to press the disc against the internal face of the platen submitted to the base, in order to ensure perfect thermal contact between the platen and the disc throughout the latter's surface. For the same reasons, the disc can alternatively be made, at least in part, from an elastic material and can have have a thickness slightly greater than the depth of the internal cavity, so that when positioned in the latter, the disc becomes pressed against the internal face of the platen submitted to the base..

Advantageously, the support's platen is made unitary with the base by means of clamps holding tight against the edges of these two elements. Alternatively, the two elements can be glued together.

Preferably, the thermometric system employs, as a temperature sensor, an electrical resistance whose resistivity has a non-zero temperature coefficient. Moreover, the support can include an electrical heating resistance. The thermometric system can in this case use the said heating resistance as the temperature sensor, the former being made from a material whose resistivity has a non-zero temperature coefficient.

More generally, the electrical resistance that can equip the support is advantageously a thin-film resistance deposited on the platen's internal face. Thus, whether the resistance ensures temperature measurement, or heating, or both functions simultaneously, temperature oscillations within the regulation range will be attenuated on the platen's external face supporting objects under test, owing to the thermal inertia of the ceramic forming the platen. Furthermore, the use of such a thin-film resistance formed along a sinuous path covering the entire useful area of the platen's inner face provides more significant measurements and/or a more uniform heating than could be obtained through a point source element.

When the platen must introduce the smallest possible stray capacitance, as is notably the case with tests on microelectronic components, it is preferable to forego the provision of such an electrical resistance on the platen and to obtain thermal regulation solely by means of thermal fluid.

The invention also has for object a thermal regulation procedure using a thermal conditioning support of the type described above, comprising a platen and a base which, when confronted, defined an inner cavity inside which flows thermal fluid for thermal regulation of the platen under control of a thermometric system associated to the said support.

This procedure consists in performing the temperature regulation solely by means of the thermal fluid itself, by acting on its temperature and/or flow rate using data supplied by the thermometric system.

In a variant, the support is fitted with an electrical resistance disposed on the platen's inner face and connectable to a power source to heat the platen using the Joule effect, while cooling of the support is ensured by the thermal fluid to obtain thermal regulation of the platen under control of the thermometric system. The process in this case consists in delivering from the power supply to the resistance an uninterrupted DC voltage whose value is chosen as a function of the reference temperature fixed for the platen, and to provide temperature regulation for the latter by acting on the temperature and/or flow rate of the cooling thermal fluid. The main advantage of such a procedure lies in that the heating resistance is not submitted to supply voltage variations, which can disturb the electrical measurements carried out on the objects under test, which in particular involve very small currents flowing inside the integrated circuits.

Preferably, the temperature regulation is obtained by on/off control of the cooling fluid flow when the platen's temperature, as indicated by the thermometric probe, reaches high and low thresholds straddling the reference temperature. This very simple regulation mode give excellent accuracy, especially when the thermometric probe is located on the platen's inner face, since temperature oscillations at that level are attenuated at the level of the platen's external face, as is explained hereabove.

The cooling fluid can be air, in which case cooling is obtained by a vortex effect device.

Other features and advantages of the invention will become clear from the following description with reference to the appended drawings based on non-limiting exemplary embodiments.

BRIEF DESCRIPTION OF THE DRAWINGS

FIG. 2 is an axial cross-section along the line II—II of FIG. 3 showing a first embodiment of the support.

FIG. 3 shows a cross-sectional view along the line III—III of the support shown in FIG. 2.

Figure 1:
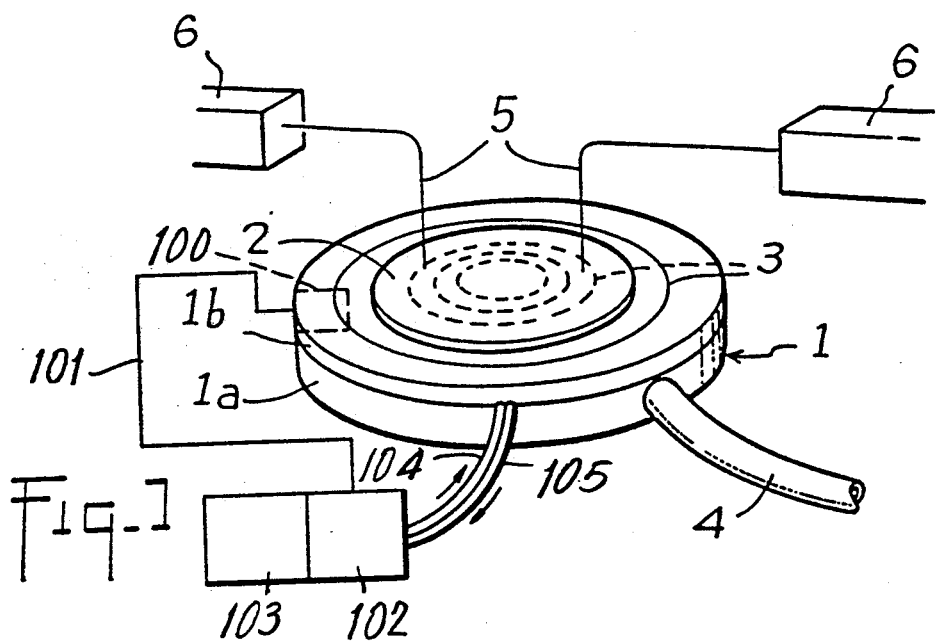
FIG. 1 is a schematic perspective view of a thermal conditioning support according to the invention.

The temperature conditioning support 1 shown in FIG. 1 is intented for testing, within their operating temperature range, integrated circuits formed on a silicon wafer 2 or other semiconductor material. It has the shape of a relatively shallow circular cylinder whose external face is designed to receive such a silicon wafer and hold it by suction induced by annular grooves 3 joined to a suction source via the flexible piping 4 connected to the support 1. Thermometric probe means 100 is connected via line 101 to regulation control source 102 which in turn is connected to heating/cooling fluid source 103. Tube lines 104 and 105 are connected to the tubular system within the base. The silicon integrated circuit wafer is electrically tested by means of contact probes 5 that are positioned by micrometric adjustment means 6, while the position of the support is adjustable by displacement of the platform on which it is mounted.

As can be seen from the cross-sectional view of figure 2, the support consists of a base 1a in the form of a flat dish and a platen 1b placed on the base 1a and defining an internal cavity 7 with the latter. The platen 1b is formed of a ceramic that is an electrical insulator while being a good thermal conductor, and has two very accurately machined plane parallel faces. The base 1a is formed of thermally insulating ceramic (or other material) whose expansion coefficient is substantially equal to that of the ceramic platen.

Inside the cavity 7 is placed a circular disc 8 having the same diameter as the said chamber, and within which are formed the concentric spirals 9a of a tube system 9 (FIG. 3) which at one end give onto an entrance chamber 10 and at the other end give onto an exit chamber 11, separated from chamber 10 by a radial partition 12. The spirals 9a of the tube system 9, and chambers 10 and 11, are delimited by a circular plate 13 covering the entire face of the disc 8 where the above-mentioned spirals and chambers are exposed.

The thus-formed tubular system 9, which completely covers the useful area of the platen 1b, is intended to convey a thermal fluid at a suitable temperature, introduced into chamber 10 and expelled from chamber 11 through the perimeter of the base 1a to bring to the desired temperature the silicon wafer 2 placed on the external face of the platen 1b. In order to guarantee good contact between the disc 8 - plate 13 assembly, the combined thickness of the disc 8 and the plate 13 is made slightly smaller than the depth of the cavity 7 so that there results a small amount of play in the disc 8 - plate 13 assembly inside the cavity along the direction of axis 14 of the support 1, enabling said assembly to press against the internal face of platen 1b by means of compression springs located in housings bored into the bottom of the base 1a.

Thermal regulation of a silicon wafer on the external face of platen 1b can be performed by injecting into the entrance chamber 10 a fluid brought to the temperature corresponding to the reference temperature of the silicon wafer 2, under control of a thermometric probe associated to platen 1b. This fluid is chosen and thermally processed so as to ensure heating or cooling of the silicon wafer 2. It can be a liquid (water of methanol) or, preferably, a gas (air or nitrogen). In this case, a fluid flow, whether it be liquid or gaseous, generates a uniform temperature throughout the useful area of the platen 1b since the dimensions of the chambers 10, 11 and conduits of the tube system 9 are such that the gas meets a constant flow cross-section, so that it is not submitted to compression or expansion which would locally alter its temperature.

Figure 4:
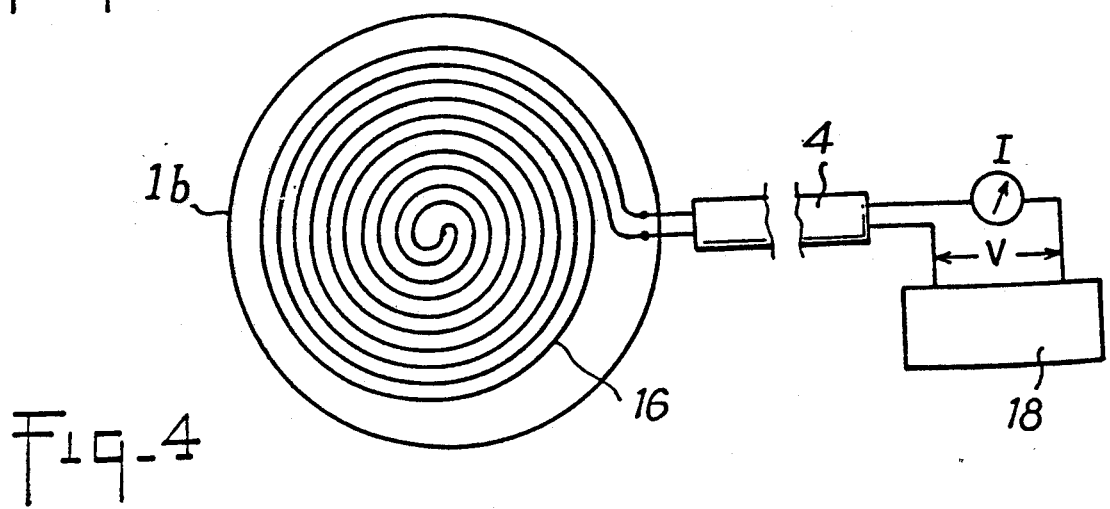
FIG. 4 is a schematic diagram of a heating resistance associated to a support according to the invention, together with its supply circuit.

An electrical resistance 16 (FIGS. 2 and 4) can be formed on the inner face of the platen 1b by depositing a thin layer of metal (platinum, nickel or gold). This resistance is supplied with electrical current from a source 18, via conductors passing inside the flexible tube 4, to heat the wafer 2 through the thickness of the platen 1b. In this case, the fluid injected into the support 1 serves only to cool the wafer 2. A refrigerated gas can then be used, the refrigeration preferably being obtained by means of a static vortex effect device. As shown in FIG. 4, the resistance 16 has the form of a double spiral extending throughout the useful area of the platen 1b to provide uniform heating to the latter. The above resistance is only an example and any other form of resistance ensuring the same uniformity may be used.

Figure 5:
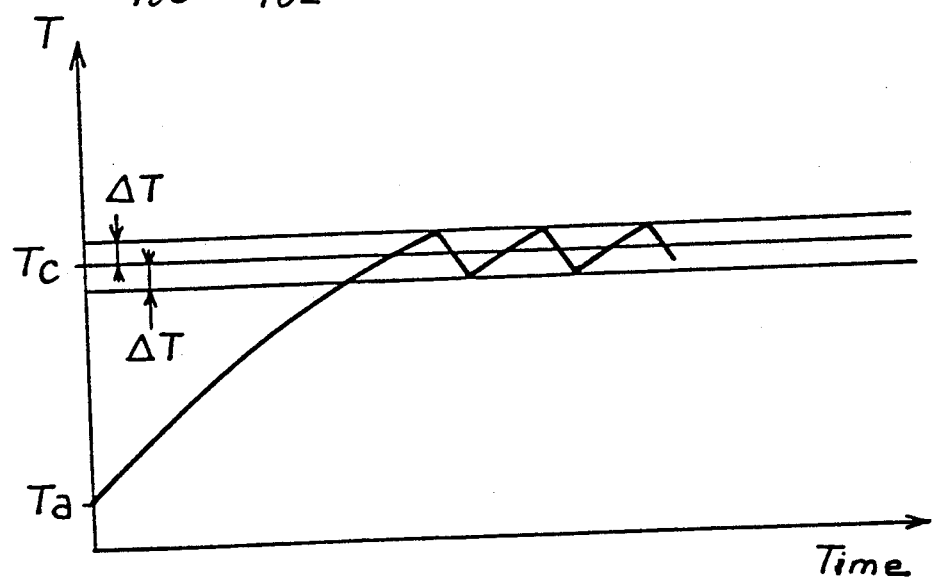
FIG. 5 is a graph illustrating a thermal regulation mode employed for a support according to the invention.

When, under these conditions, it is intended to maintain the temperature T of the platen 1b at a specific reference temperature Tc, the heating resistance 16 is submitted to a constant value DC voltage V determined as a function of the temperature Tc (by precalibration) and proportional to that temperature. With no cooling fluid injected, the platen 1b warms up from an ambient temperature Ta until it exceeds temperature Tc by an amount $\Delta T$ (FIG. 5). The reaching of this upper threshold, detected by the thermometric probe associated to the platen 1b, triggers the injection of cooling fluid into the support 1 so that the temperature of the internal face of the platen 1b rapidly decreases to a value Tc-$\Delta T$ corresponding to a lower temperature threshold. Injection of cooling fluid is then stopped and the temperature of the platen 1b resumes its increase under the effect of the heating resistance 16, to which is applied a constant uninterrupted voltage V. The temperature of the platen 1b thus oscillates along a sawtooth curve about the reference temperature Tc within an amplitude range $\pm \Delta T$. The above more precisely concerns the temperature of the internal face of the platen 1b on which are situated the heating resistance 16 and the thermometric probe. As concerns the external face of the platen which supports the wafer 2, its temperature also oscillates, but along a curve of smaller amplitude and smoother shape owing to the thermal inertia of the platen's ceramic material.

In practice, the voltage value V is chosen so that the warming up rate in the region of the desired reference temperature Tc is of the order of 0.5° C. per minute in the absence of cooling fluid. It has been observed, moreover, that if the temperature regulation is within eg $\pm 0.5°$ C. on the platen's inner face, the regulation range narrows approximately $\pm 0.1°$ C. on the platen's external face, owing to the thermal inertia of the ceramic. This justifies the adoption of the above-described pulse mode regulation, in which the cooling fluid is injected during brief time periods.

Instead of having the thermometric probe consisting of a separate element such as a thermocouple, the heating resistance 16 itself can be used. In this case, the material should be chosen so that its resistivity varies sufficiently with temperature (gold is suitable here) so that, by measuring the current flow I, the resistance R=V/I can be calculated, enabling the temperature, which is a direct function of resistance R, to be deduced after a precalibration operation.

Figure 6:
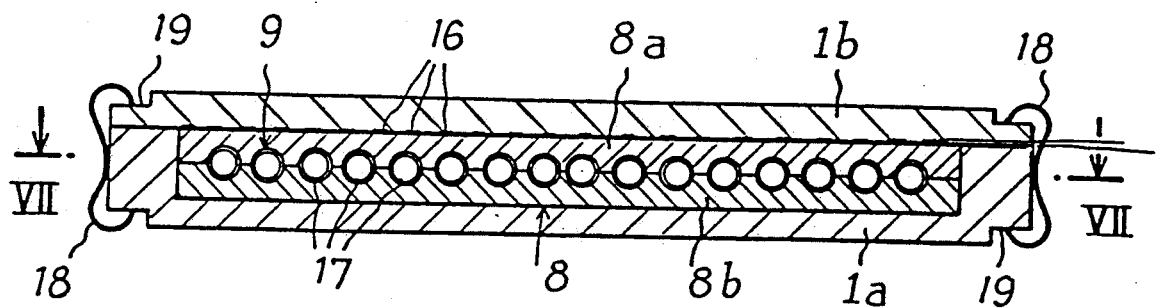
FIGS. 6 and 7, along with 8 and 9 show, in a similar manner to FIGS. 2 and 3, a second and third embodiment of a support according to the invention, respectively.
Figure 7:
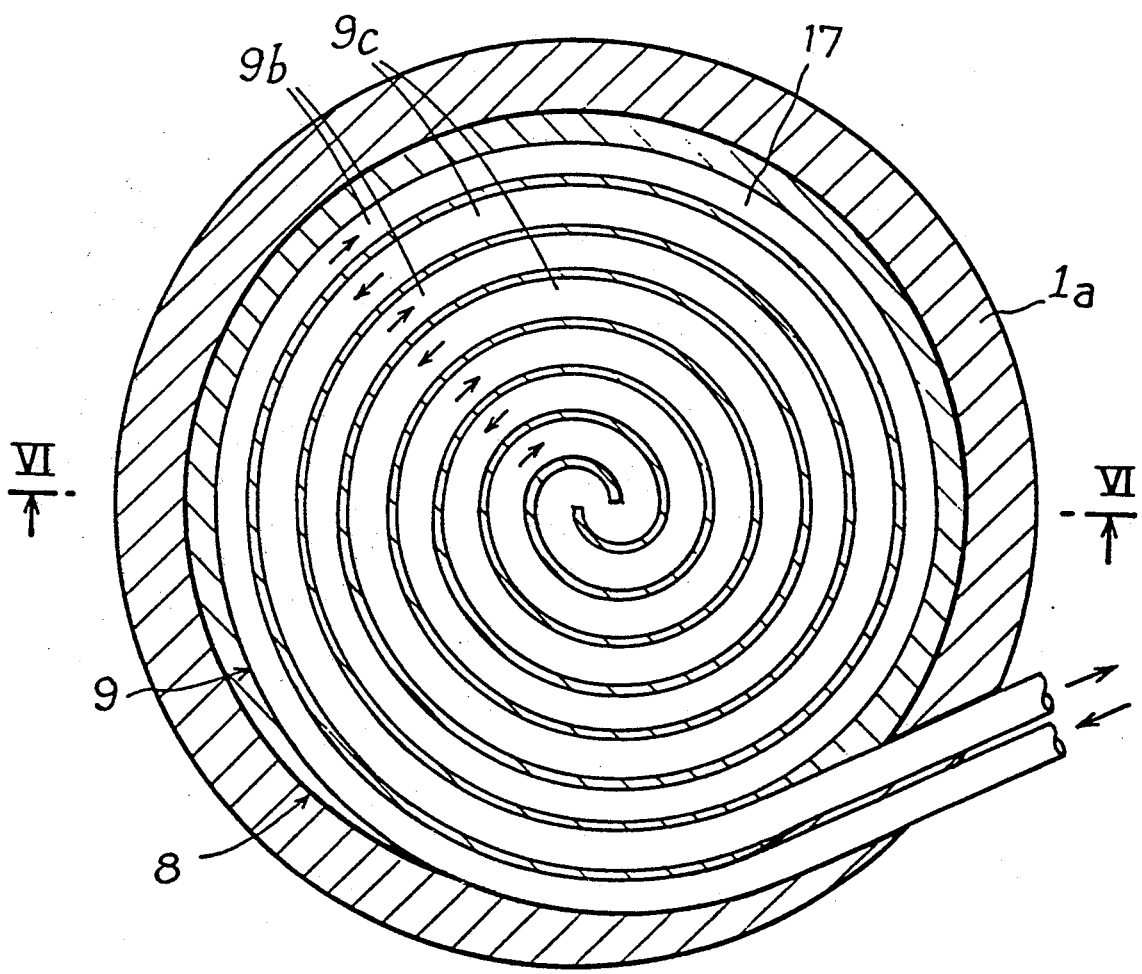

FIGS. 6 and 7 show an alternative embodiment where the same reference numerals designate equivalent elements. The hollow base 1a is shown closed by the ceramic platen 1b on the inner face of which is a heating resistance 16 also serving as a thermometric probe. The hollow base 1a contains a disc 8 which, however, has a different structure to that of the first embodiment (FIGS. 2 and 3). Here, it is composed of two layers 8a, 8b, and more specifically a layer 8a formed of resin or conductive grease on the internal face of the platen, and a flexible and thermally insulating layer 8b on the opposite face. The tube system 9 is formed by the tube 17 buried between the two layers and preferably made from a heat conducting material (copper of aluminium) defining a double spiral serpentine, covering the entire surface of the disc, and which in use conveys the cooling fluid. This specific configuration for the tube 17 offers an advantage in that the fluid flow in two adjacent convolutions 9b, 9c is in opposite directions and that the average temperature is the same everywhere, so providing excellent temperature uniformity throughout the surface of the wafer. Moreover, because the tube 17 has a constant flow cross-section, it is perfectly suitable to use a gaseous fluid, as with the first embodiment.

Furthermore, the thickness of the disc 8 is slightly greater than the depth of the inner cavity of the base 1a. Consequently, when the platen 1b is inserted on the base 1a containing the disc 8, the flexible layer 8b of the latter becomes slightly squashed and, by its elasticity provides optimal pressure on the face of the other layer in contact with the internal face of the platen 1b. This arrangement obviates the need for compression springs, such as springs 15 of the device shown in FIGS. 2 and 3.

Figure 8:
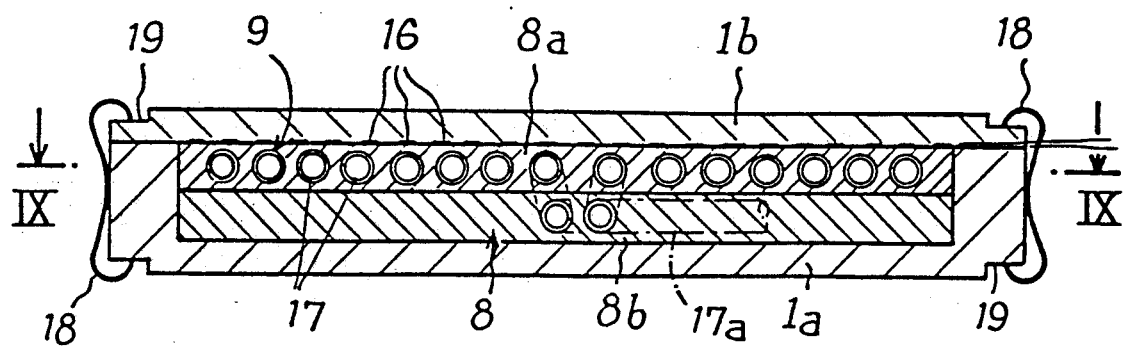
Figure 9:
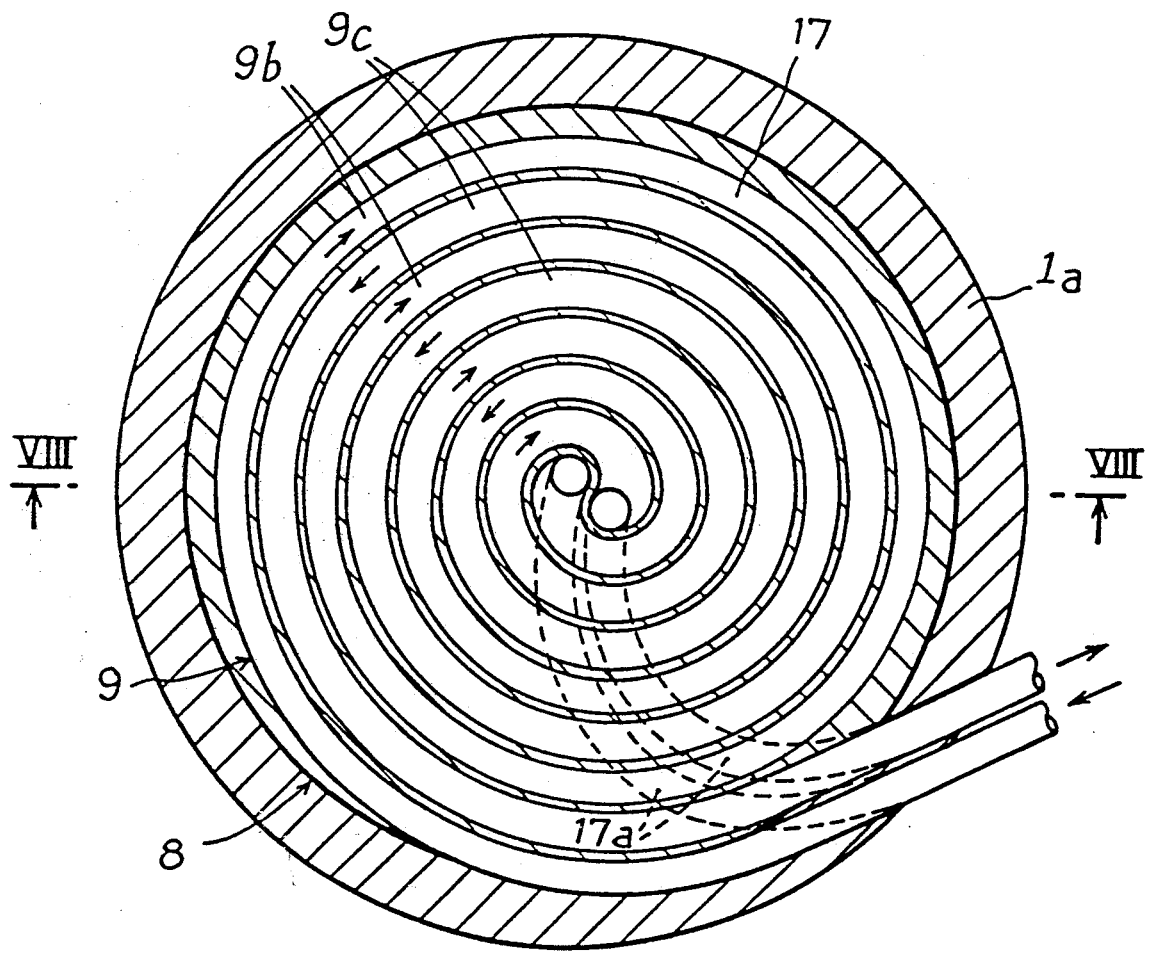

FIG. 9 shows a slightly different configuration that can be given to be tube 17. Here, the double spiral serpentine comprises two interlaced spiral elements 9a, 9b each extending from the edge of the disc 8 up to its centre. The edge extremity of each spiral element is connected to the central extremity of the other element so that fluid flows in opposite directions in the successive spirals of the serpentine, as in the embodiment of FIG. 7. In FIG. 8, the serpentine is buried in the upper layer 8a of the disc 8. It is made from heat conducting material and the connecting portions 17a of the two spiral elements 9a, 9b are located beneath, in the lower layer of the disc made from thermally insulating material.

In addition, FIGS. 6 and 8 show a means for fixing the platen 1b onto the base 1a using elastic clamps 18 tightening against the edges of the two elements, on which are provided notches or continuous grooves 19 designed to receive these clamps. Such a fixing system offers the advantage of easy assembling and dismantling of the assembly compared with classical screw based systems. Indeed, screw type fixing systems require a special control procedure for the tightening torques applied thereto, which would be particularly difficult to conduct in the case of ceramic elements, an overtightened screw being likely to crack the ceramic owing to expansions brought about by temperature variations. With the proposed fixing system, thermal expansions affecting the thickness or width of the support are automatically compensated for, without risk of breakage. A similar system can advantageously be used for fixing the ceramic support onto the platform of the machine with which it is to be used.

Alternatively, the platen 1b and base 1a can be glued together. Also, the support that they define and which has a circular contour in the above description, can also can be given a square contour.

In the case where the thermal fluid is a dry gas (eg. air or nitrogen), it is an advantage to use the outflow of this gas from the tube system to provide a surface flow on the platen 1b. This prevents condensation and ambient humidity from settling on the latter when cooled to low temperatures (−50° C. for example) while providing additional refrigeration, which enhances cooling.

What is claimed is:

1. A temperature conditioning support suitable for conducting thermal tests on semi-conductor components containing integrated circuits, comprising a platen comprising an electrically insulating and thermally conducting ceramic material and a base comprising a thermally insulating ceramic that receives said platen, said platen and said base being conformed such that when assembled they define an enclosed internal cavity containing within a concentric tubular system in which a thermal fluid capable of heating or cooling said platen can circulate, providing a flow path with substantially uniform cross-section for said fluid, the temperature of an object placed on said platen being regulated by the heating or cooling of said platen by means of data received from thermometric system having temperature sensor means associated with said support.

2. A support as claimed in claim 1, wherein the platen is in the form of a disk defining two flat and parallel faces and the base is in the form of a dish.

3. A support as claimed in claim 2, wherein the tube system includes several constant cross-section conduits arranged in parallel.

4. A support as claimed in claim 2, wherein the tube system is formed by one constant cross-section conduit arranged in the form of a double spiral such that adjacent convolutions convey the thermal fluid along opposite directions.

5. A support as claimed in claim 2, wherein the tube system is formed directly within the platen or within the base.

6. A support as claimed in claim 2, wherein the tube system is formed within a disk occupying the internal cavity.

7. A support as claimed in claim 6, wherein the height of the disk is slightly less than the depth of the internal cavity, and springs are provided in the base to press the disk against the internal face of the platen submitted to the base.

8. A support as claimed in claim 6, wherein the disk is made, at least in part, of an elastic material and has a thickness that is slightly greater than the depth of the internal cavity so that when inserted into the latter, the disk comes to press against the internal face of the platen submitted to the base.

9. A support as claimed in claim 1, wherein the platen is joined to the base by clamps that press against the edges of said platen and base.

10. A support as claimed in claim 1, wherein the platen and the base are joined together by gluing.

11. A support as claimed in claim 1, wherein the temperature sensor for the thermometric system is an electrical resistance whose resistivity has a non-zero temperature coefficient.

12. A support as claimed in claim 1, which includes an electrical heating resistance.

13. A support as claimed in claim 12, wherein the temperature sensor for the thermometric system is an electrical heating resistance, made of a material whose resistivity has a non-zero temperature coefficient.

14. A support as claimed in claim 11, wherein the electrical resistance fitted thereto is a thin-film resistance deposited on the inner face of the platen.

15. A thermal regulation process using the temperature conditioning support according to claim 1, consisting of a platen and a base which, when assembled, define an internal cavity in which flows a thermal fluid for thermal regulation of the platen under control of a thermometric system associated with said support, wherein the temperature regulation is performed solely by means of the thermal fluid itself, by playing on its temperature and/or its flowrate on the basis of data supplied by the thermometric system.

16. A thermal regulation process using a temperature conditioning support according to claim 12, consisting of a platen and a base which when assembled together define an internal cavity in which flows a thermal fluid, and electrical resistance disposed on the internal face of the platen, connectable to a supply source to cause heating of the platen through the Joule effect, while cooling of the latter is ensured by the thermal fluid, thereby to achieve thermal regulation of said platen under control of a thermometric system associated with said support, wherein the supply source applies to the resistance an uninterrupted constant DC voltage whose value is chosen as a function of the reference temperature determined for the platen, and temperature regulation of the latter is dependent upon the temperature and/or flowrate of the cooling fluid.

17. A process as claimed in claim 16, wherein temperature regulation is effected by an on-off control of the thermal fluid flow when the temperature of the platen indicated by the thermometric system reaches upper and lower thresholds straddling the reference temperature.

18. A process as claimed in claim 15, wherein the thermal fluid is air, the cooling of which is ensured by a vortex type device.

19. A process as claimed in claim 15, wherein the thermal fluid is a dry gas and the outflow of said fluid is utilized to blow on the surface of the platen so as to prevent condensation on the latter.

* * * * *